United States Patent
Hanamoto

(10) Patent No.: US 8,209,043 B2
(45) Date of Patent: Jun. 26, 2012

(54) ASSEMBLY INFORMATION MANAGEMENT APPARATUS, AND ASSEMBLY INFORMATION MANAGEMENT METHOD

(75) Inventor: Kazuhisa Hanamoto, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 708 days.

(21) Appl. No.: 12/343,631

(22) Filed: Dec. 24, 2008

(65) Prior Publication Data

US 2009/0216358 A1 Aug. 27, 2009

(30) Foreign Application Priority Data

Dec. 28, 2007 (JP) ................................ 2007-340264

(51) Int. Cl.
*G06F 19/00* (2011.01)
(52) U.S. Cl. .......... 700/98; 700/178; 700/182; 345/420; 345/619
(58) Field of Classification Search .................... 700/98, 700/178, 182; 703/7; 345/419–420, 619–620
See application file for complete search history.

(56) References Cited

U.S. PATENT DOCUMENTS

| | | | | |
|---|---|---|---|---|
| 6,452,604 | B1 * | 9/2002 | Sato | 345/619 |
| 6,812,924 | B2 * | 11/2004 | Kondo | 345/420 |
| 7,565,216 | B2 * | 7/2009 | Soucy | 700/98 |
| 2004/0199367 | A1 * | 10/2004 | Kondo | 703/7 |
| 2008/0094394 | A1 * | 4/2008 | Thomas et al. | 345/420 |

FOREIGN PATENT DOCUMENTS

| JP | 5-20403 A | 1/1993 |
|---|---|---|
| JP | 2007-257082 A | 10/2007 |

* cited by examiner

*Primary Examiner* — Albert Decady
*Assistant Examiner* — Douglas Lee
(74) *Attorney, Agent, or Firm* — Fujitsu Patent Center

(57) ABSTRACT

An assembly information management apparatus includes a detection means for detecting an update of a selected part selected from a group of parts constituting any assembly information in the set, a first calculation means for calculating outline shape data of the selected part after being updated from the selected part detected by the detection means, an identification means for identifying a common assembly information group sharing the selected part from the set, a second calculation means for calculating outline shape data of common assembly information for each piece of common assembly information identified by the identification means based on outline shape data of remaining parts after excluding the selected part constituting the common assembly information and outline shape data of the selected part after being updated calculated by the first calculation means, and an association means for associating each piece of the common assembly information with outline shape data.

7 Claims, 23 Drawing Sheets

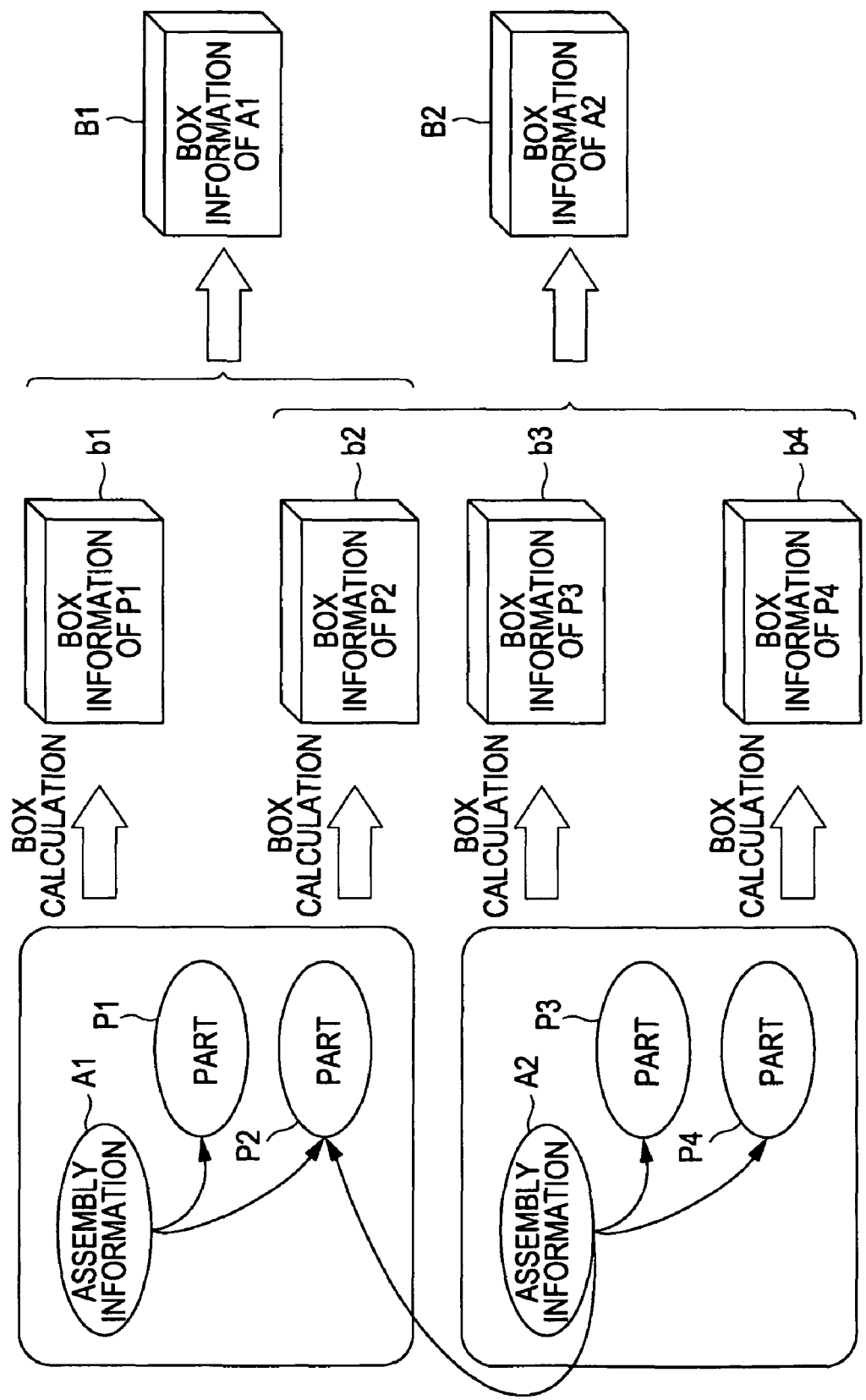

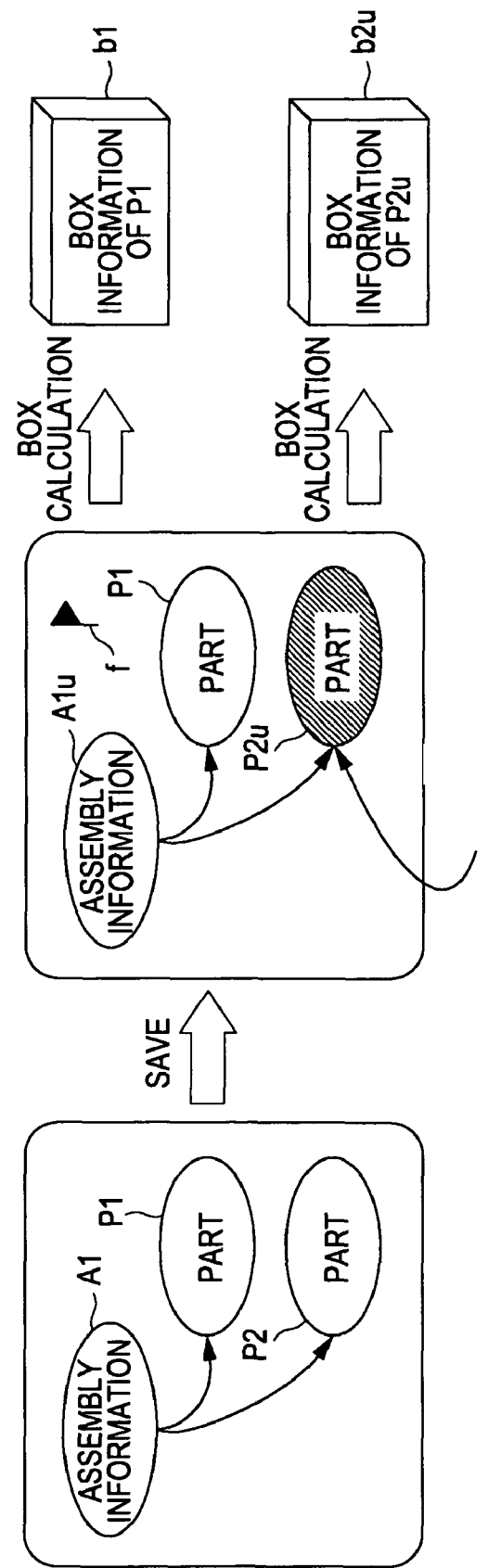

FIG. 9

| ASSEMBLY INFORMATION TABLE 900 ||||
|---|---|---|---|
| ASSEMBLY INFORMATION ID | PART ID | BOX INFORMATION | UPDATE FLAG f |
| A1 | P1<br>P2<br>P3 | B1 =<br>(xA1a, xA1b/yA1a, yA1b/zA1a, zA1b) | 0 |
| A2 | ...<br>... | B2 | 0 |
| A3 | ...<br>... | B3 | 0 |
| A4 | ...<br>... | B4 | 0 |
| A5 | ...<br>... | B5 | 0 |
| A6 | P3<br>P4<br>P5 | B6 =<br>(xA6a, xA6b/yA6a, yA6b/zA6a, zA6b) | 0 |
| A7 | ...<br>... | B7 | 0 |
| A8 | ...<br>... | B8 | 0 |
| A9 | ...<br>... | B9 | 0 |
| A10 | ...<br>... | B10 | 0 |
| ... | ... | ... | ... |

FIG. 10

PART INFORMATION TABLE 1000

| PART ID | BOX INFORMATION | UPDATE FLAG f |
|---|---|---|
| P1 | b1 = (xP1a, xP1b/yP1a, yP1b/zP1a, zP1b) | 0 |
| P2 | b2 = (xP2a, xP2b/yP2a, yP2b/zP2a, zP2b) | 0 |
| P3 | b3 = (xP3a, xP3b/yP3a, yP3b/zP3a, zP3b) | 0 |
| P4 | b4 = (xP4a, xP4b/yP4a, yP4b/zP4a, zP4b) | 0 |
| P5 | b5 = (xP5a, xP5b/yP5a, yP5b/zP5a, zP5b) | 0 |
| ... | ... | ... |

FIG. 14

PART INFORMATION TABLE ~1000

| PART ID | BOX INFORMATION | UPDATE FLAG f |
|---------|-----------------|---------------|
| P1 | b1 = (xP1a, xP1b/yP1a, yP1b/zP1a, zP1b) | 0 |
| P2 | b2 = (xP2a, xP2b/yP2a, yP2b/zP2a, zP2b) | 0 |
| P3 | b3 = [xP3a, xP3b/yP3a, yP3b/zP3a, zP3b] | 1 |
| P4 | b4 = (xP4a, xP4b/yP4a, yP4b/zP4a, zP4b) | 0 |
| P5 | b5 = (xP5a, xP5b/yP5a, yP5b/zP5a, zP5b) | 0 |
| ⋮ | ⋮ | ⋮ |

FIG. 15

ASSEMBLY INFORMATION TABLE 900

| ASSEMBLY INFORMATION ID | PART ID | BOX INFORMATION | UPDATE FLAG f |
|---|---|---|---|
| A1(u) | P1<br>P2<br>P3(u) | B1 = (xA1a, xA1b/yA1a, yA1b/zA1a, zA1b) | 1 |
| ... | ... | ... | ... |
| A6 | P3<br>P4<br>P5 | B6 = (xA6a, xA6b/yA6a, yA6b/zA6a, zA6b) | 1 |
| ... | ... | ... | ... |

FIG. 16

ASSEMBLY INFORMATION TABLE (900)

| ASSEMBLY INFORMATION ID | PART ID | BOX INFORMATION | UPDATE FLAG f |
|---|---|---|---|
| A1(u) | P1 | B1u = [xA1a, xA1b/yA1a, yA1b/zA1a, zA1b] | 1 |
| | P2 | | |
| | P3(u) | | |
| ... | ... | ... | ... |
| A6(u) | P3(u) | B6u = [xA6a, xA6b/yA6a, yA6b/zA6a, zA6b] | 1 |
| | P4 | | |
| | P5 | | |
| ... | ... | ... | ... |

FIG. 17

ASSEMBLY INFORMATION TABLE 900

| ASSEMBLY INFORMATION ID | PART ID | BOX INFORMATION | UPDATE FLAG f |
|---|---|---|---|
| A1(u) | P1 | $B1u = (xA1a, xA1b/yA1a, yA1b/zA1a, zA1b)$ | 0 |
|  | P2 |  |  |
|  | P3(u) |  |  |
| ... | ... | ... | ... |
| A6(u) | P3(u) | $B6u = (xA6a, xA6b/yA6a, yA6b/zA6a, zA6b)$ | 0 |
|  | P4 |  |  |
|  | P5 |  |  |
| ... | ... | ... | ... |

FIG. 18

PART INFORMATION TABLE (1000)

| PART ID | BOX INFORMATION | UPDATE FLAG f |
|---|---|---|
| P1 | b1 = (xP1a, xP1b/yP1a, yP1b/zP1a, zP1b) | 0 |
| P2 | b2 = (xP2a, xP2b/yP2a, yP2b/zP2a, zP2b) | 0 |
| P3 | b3 = [xP3a, xP3b/yP3a, yP3b/zP3a, zP3b] | 0 |
| P4 | b4 = (xP4a, xP4b/yP4a, yP4b/zP4a, zP4b) | 0 |
| P5 | b5 = (xP5a, xP5b/yP5a, yP5b/zP5a, zP5b) | 0 |
| ... | ... | ... |

ASSEMBLY INFORMATION MANAGEMENT APPARATUS, AND ASSEMBLY INFORMATION MANAGEMENT METHOD

CROSS-REFERENCE TO RELATED APPLICATIONS

This application is based upon and claims the benefit of priority of the prior Japanese Patent Application No. 2007-340264 filed on Dec. 28, 2007, the entire contents of which are incorporated herein by reference.

BACKGROUND

1. Field

The present invention relates to an assembly information management apparatus to manage a set of assembly information constituted by a plurality of parts, and an assembly information management method.

2. Description of Related Art

When representing a three-dimensional model in a three-dimensional CAD system, the three-dimensional model consists of a group of files having shape data like parts models constituting the three-dimensional model, and a file controlling the group of files and having no shape data in itself. The files having shape data are called "parts" and the files having no shape data are called "assembly information." That is, assembly information does not refer to each part but instead refers to a unit of a plurality of assembled parts.

A designer changes shapes of parts while coordinating with peripheral parts in the course of design. In this case, regarding peripheral parts, outline shape information of three-dimensional models having assembly information, which is called "box information," as a structural unit is acquired from a system in which each piece of assembly information is registered before conducting a search. Then a search is conducted on the system using the acquired box information to obtain peripheral three-dimensional models acquired as assembly information by the search.

As a technology regarding interference checks of three-dimensional models, a technology can be considered that determines whether boundaries of parts interfere with each other by moving models of parts using a three-dimensional CAD (Computer Aided Design) system and, if interference occurs, stops further movement of the parts and controls the parts so that the parts are not in intersecting states, and displays the parts on a monitor.

Also a technology can be considered that determines whether or not an interference check was performed in the past, excludes parts models that were not changed from check targets and outputs interference check results in the past for such excluded models.

When a part constituting assembly information is edited in a three-dimensional CAD system, the updated assembly information constituted by the edited part is stored by saving the edited part. Then, calculation of new box information of three-dimensional models having the assembly information as a structural unit is triggered by the saving.

If, for example, a part edited from one piece of assembly information is also a part constituting another piece of assembly information, new box information of three-dimensional models having the one piece of assembly information as a structural unit can be obtained by saving the one piece of assembly information, as described above.

However, because no editing is done in the other piece of assembly information, the edited part is not saved in the other piece of assembly information. Therefore, box information of three-dimensional models having the other piece of assembly information as a structural unit is not updated even after a common part shared with the one piece of assembly information is updated.

Thus, regarding the other piece of assembly information, box information used for a search remains in a state before a common part is updated even if the three-dimensional geometric model is in an updated state and thus, the three-dimensional geometric model does not correspond to the box information. Therefore, even if a search is conducted using box information as a cue, a desired search result cannot be obtained, causing a problem in design work.

If interference checks with peripheral assembly information are attempted to be performed using geometric models, it will take a very long time to file check out the geometric models due to an enormous amount of data. Thus, file check-out work can be made more efficient by using outline shape data such as box information, but if the box information does not correspond with the latest geometric model, there is a problem that an error occurs in an interference check itself.

SUMMARY

According to an aspect of the invention, an assembly information management apparatus, for managing a set of assembly information constituted by a plurality of parts, includes detection means for detecting an update of a selected part selected from a group of parts constituting any assembly information in the set, first calculation means for calculating outline shape data of the selected part after being updated from the selected part detected by the detection means, identification means for identifying a common assembly information group sharing the selected part from the set, second calculation means for calculating outline shape data of common assembly information for each piece of common assembly information identified by the identification means based on outline shape data of remaining parts after excluding the selected part constituting the common assembly information and outline shape data of the selected part after being updated calculated by the first calculation means, and association means for associating each piece of the common assembly information with outline shape data calculated by the second calculation means.

Additional objects and advantages of the embodiment will be set forth in part in the description which follows, and in part will be obvious from the description, or may be learned by practice of the invention. The object and advantages of the invention will be realized and attained by means of the elements and combinations particularly pointed out in the appended claims.

It is to be understood that both the foregoing general description and the following detailed description are exemplary and explanatory only and are not restrictive of the invention, as claimed.

BRIEF DESCRIPTION OF THE DRAWINGS

FIG. 1A is an explanatory diagram showing relationships among assembly information, a hierarchical structure of parts, and outline shape data according to the present embodiment;

FIG. 1C is an explanatory diagram showing box information of each part after a part to be a component of assembly information A1 is updated;

FIG. 9 is an explanatory diagram showing storage content of an assembly information table;

FIG. 10 is an explanatory diagram showing storage content of a part information table;

FIG. 14 is an explanatory diagram showing storage content of the part information table in a state at step S1304;

FIG. 15 is an explanatory diagram showing storage content of the assembly information table in a state at step S1307;

FIG. 16 is an explanatory diagram showing storage content of the assembly information table in a state at step S1308;

FIG. 17 is an explanatory diagram showing storage content of the assembly information table when an update flag is reset (step S1209) after the box information calculation processing (step S1206); and FIG. 18 is an explanatory diagram showing storage content of the part information table when the update flag is reset (step S1209) after the box information calculation processing (step S1206).

DETAILED DESCRIPTION OF EXAMPLES OF EMBODIMENTS

Figure 1B:
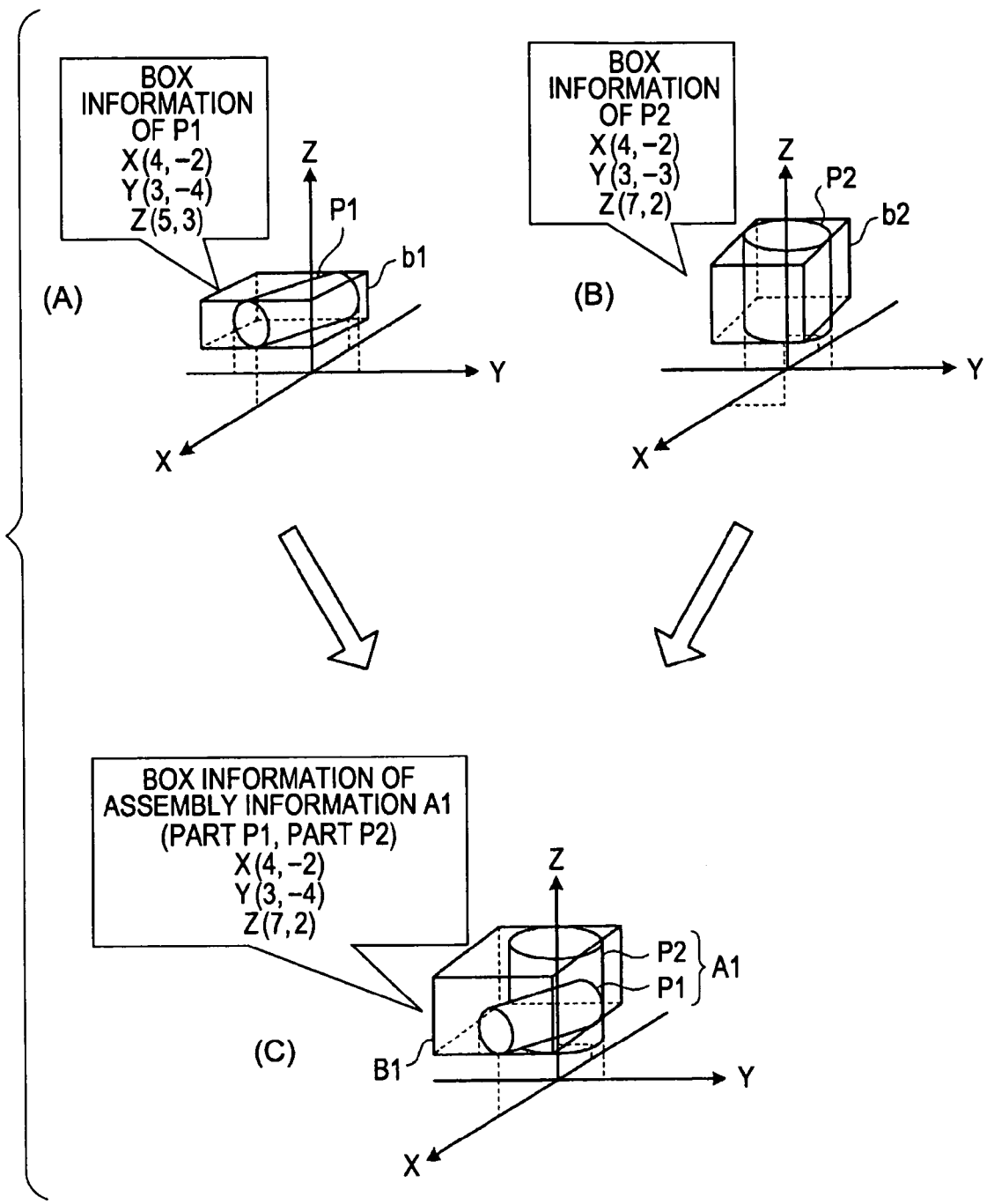
FIG. 1B is an explanatory diagram showing a calculation example of box information of assembly information.

A preferred embodiment of the computer readable recording medium recording the assembly information management program, assembly information management apparatus, and assembly information management method will be described in detail below with reference to the drawings. In the present embodiment, an industrial product such as an automobile or a computer device is formed into a three-dimensional geometric model before being applied to a system for designing the product by a computer (for example, a three-dimensional CAD system). The industrial product is represented as an aggregate of fine parts.

Each part is a file having a three-dimensional geometric model and is assembled by assembly information having no geometric model. If, for example, assembly information corresponds to an engine of an automobile, the assembly information includes a group of parts such as heads, cylinders, cams, pistons, shafts, gears, sensors, and covers. This also applies when assembly information is present hierarchically at a level higher than assembly information. If, for example, assembly information at the highest level corresponds to an automobile, the assembly information consists of a group of pieces of assembly information of an engine, a frame, a transmission, a harness, and the like, and each piece of assembly information consists of a group of respective parts. In this manner, assembly information and parts are made hierarchical.

Regarding assembly information, outline shape data of a three-dimensional model constituting the assembly information is calculated, and in the present embodiment, outline shape data of each part is further calculated and outline shape data of the three-dimensional model constituting the assembly information is calculated based on calculation results. Relationships among assembly information according to the present embodiment, a hierarchical structure of parts, and outline shape data will be described below with reference to FIG. 1A to FIG. 1E.

Outline shape data is data whose data size is smaller than that of a target object (for assembly information, a three-dimensional geometric model consisting of a group of parts constituting the assembly information, and for a part, a three-dimensional geometric model of the part). For example, outline shape data can be represented by a maximum value and a minimum value of an X coordinate, those of a Y coordinate, and those of a Z coordinate of an object in a three-dimensional coordinate system. A set of such coordinates is called "box information." The object will be inscribed in a cube whose vertices are coordinates of the box information.

FIG. 1A is an explanatory diagram showing relationships among assembly information, a hierarchical structure of parts, and outline shape data according to the present embodiment. In FIG. 1A, the assembly information A1 is a three-dimensional geometric model having a part P1 and a part P2 as components, and assembly information A2 is a three-dimensional geometric model having the part P2 and parts P3 and P4 as components. The part P2 is a common part shared by the assembly information A1 and the assembly information A2.

When assembly information is registered with a three-dimensional CAD system, box information of each part is calculated. For the assembly information A1, for example, box information b1 of the part P1 and box information b2 of the part P2 are calculated. Similarly, box information b3 of the part P3 and box information b4 of the part P4 are calculated for the assembly information A2. Since the box information b2 of the part P2 is already calculated for the assembly information A1, it is not calculated here.

Then, box information of assembly information is calculated for each piece of assembly information by accumulating box information of a group of constituent parts. For example, the box information b1 and the box information b2 are accumulated for the assembly information A1 to obtain box information B1 and the box information b2, the box information b3, and the box information b4 are accumulated for the assembly information A2 to obtain box information B2.

Here, accumulation is a calculation method by which box information of each part is compared to each other and the maximum values and the minimum values are selected from among the box information to set assembly information. More specifically, the maximum value is selected from among the maximum values of the X coordinate of each part, the minimum value is selected from among the minimum values of the X coordinate of each part, the maximum value is selected from among the maximum values of the Y coordinate of each part, the minimum value is selected from among the minimum values of the Y coordinate of each part, the maximum value is selected from among the maximum values of the Z coordinate of each part, and the minimum value is selected from among the minimum values of the Z coordinate of each part. A set of the selected coordinate values becomes box information of the assembly information.

FIG. 1B is an explanatory diagram showing a calculation example of box information of assembly information. In FIG. 1B, (A) shows the part P1 and the box information b1 thereof, (B) shows the part P2 and the box information b2 thereof, and (C) shows the assembly information A1 consisting of the part P1 and the part P2 and the box information B1 thereof.

If (A) and (B) are compared, the combination of the maximum value and minimum value of the X coordinate in the assembly information A1 will be (4, −2) because both the part P1 and the part P2 have (4, −2) as the combination of maximum value and minimum value of the X coordinate. The combination of the maximum value and minimum value of the Y coordinate in the assembly information A1 will be (3, −4) because the part P1 has (3, −4) and the part P2 has (3, −3) as the combinations of maximum value and minimum value of the Y coordinate. The combination of the maximum value and minimum value of the Z coordinate in the assembly information A1 will be (7, 2) because the part P1 has (5, 3) and the part P2 has (7, 2) as the combinations of maximum value and minimum value of the Z coordinate.

FIG. 1C is an explanatory diagram showing box information of each part after a part to be a component of the assembly information A1 is updated. Hereafter, "u" is attached to the end of reference symbols like, "A1u," to emphasize "after being updated."

If the part P2 in the assembly information A1 is edited and saved, the assembly information A1 after being updated consists of the part P1 and the updated part P2u and an update flag f is set (f=1). The assembly information A1 after the update flag f is set is denoted as A1u. Then, the box information b2u is obtained by box calculation of the part P2u.

Figure 1D:
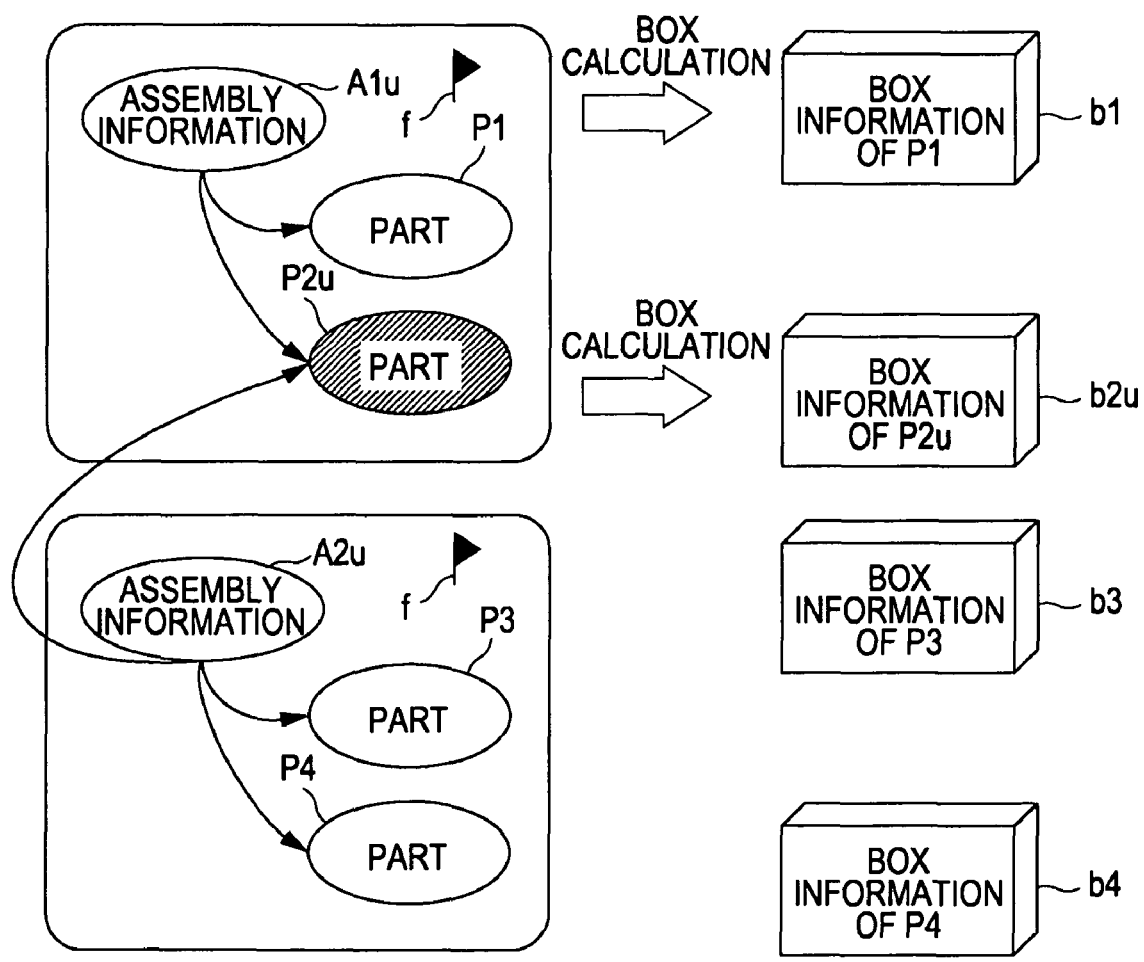
FIG. 1D is an explanatory diagram showing box information of parts after the assembly information A1 is updated.

FIG. 1D is an explanatory diagram showing box information of parts constituting the assembly information A1 after the assembly information A1 is updated. In FIG. 1D, since the updated part P2u in the assembly information A1u is a common part shared with the assembly information A2, the update flag f is set (f=1) also for the assembly information A2 that is not updated with an update of the assembly information A1u. The assembly information A2 after the update flag f is set is denoted as A2u.

Figure 1E:
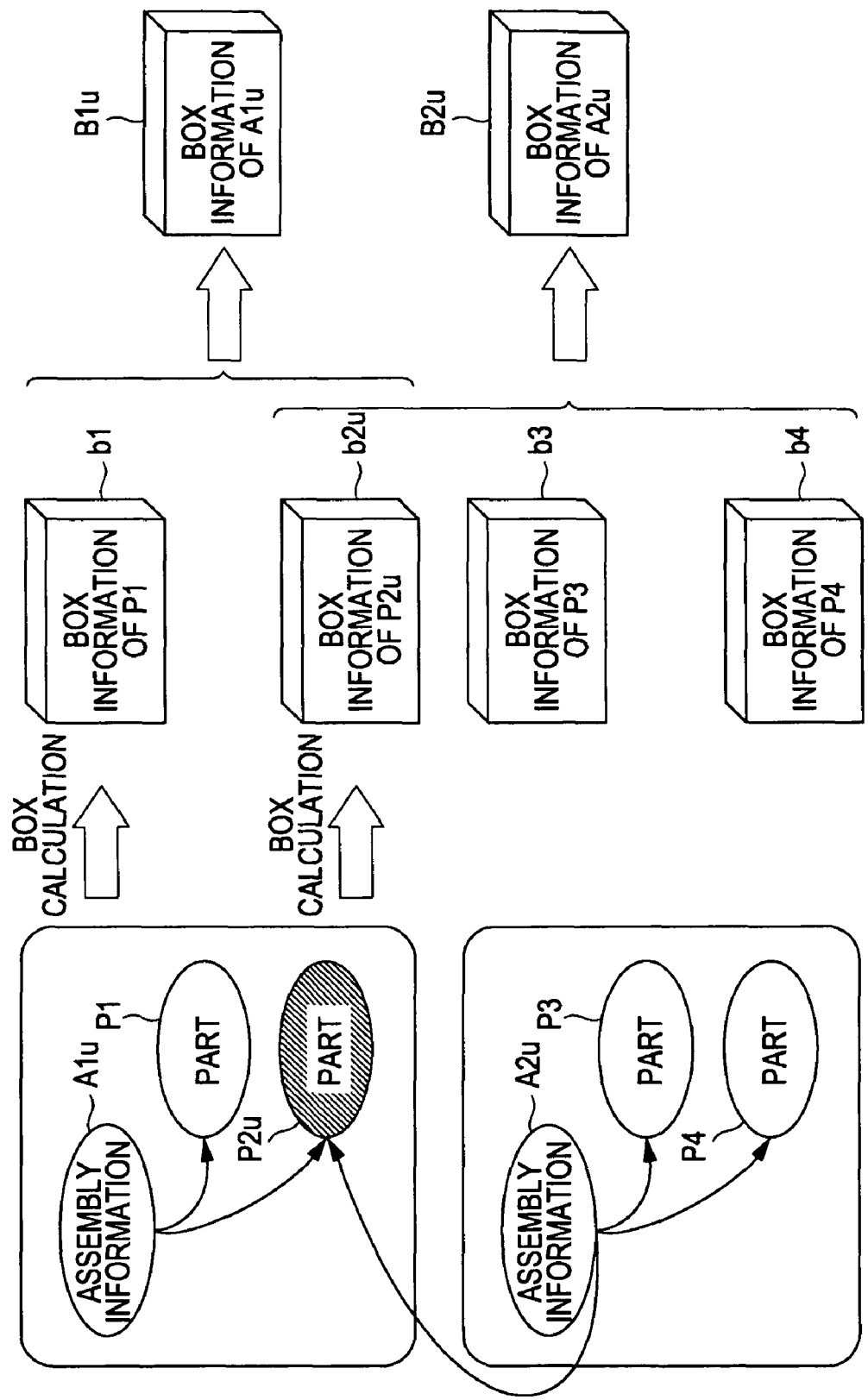
FIG. 1E is an explanatory diagram showing recalculation of box information of each piece of assembly information after the assembly information A1 is updated.

FIG. 1E is an explanatory diagram showing recalculation of box information of each piece of assembly information A1u and A2u after the assembly information A1 is updated. For the assembly information A1u after being updated, the box information B1u of the updated assembly information A1u is obtained by accumulating the box information b1 of the part P1 and the box information b2u of the updated part P2u. Similarly, for the assembly information A2u after being updated, the box information B2u of the updated assembly information A2u is obtained by accumulating the box information b2u of the updated part P2u, the box information b3 of the part P3, and the box information b4 of the part P4.

Thus, if a common part in one piece of assembly information having the common part (the part P2 in FIG. 1A and FIG. 1C to FIG. 1E) as a component is edited, along with recalculation of box information of the assembly information, box information of another assembly information having the common part as a component is recalculated. Therefore, the box information will correspond to a geometric model. Accordingly, a desired search result will be obtained by conducting a search using box information as a cue.

(System Configuration of an Assembly Information Management System)

Figure 2:
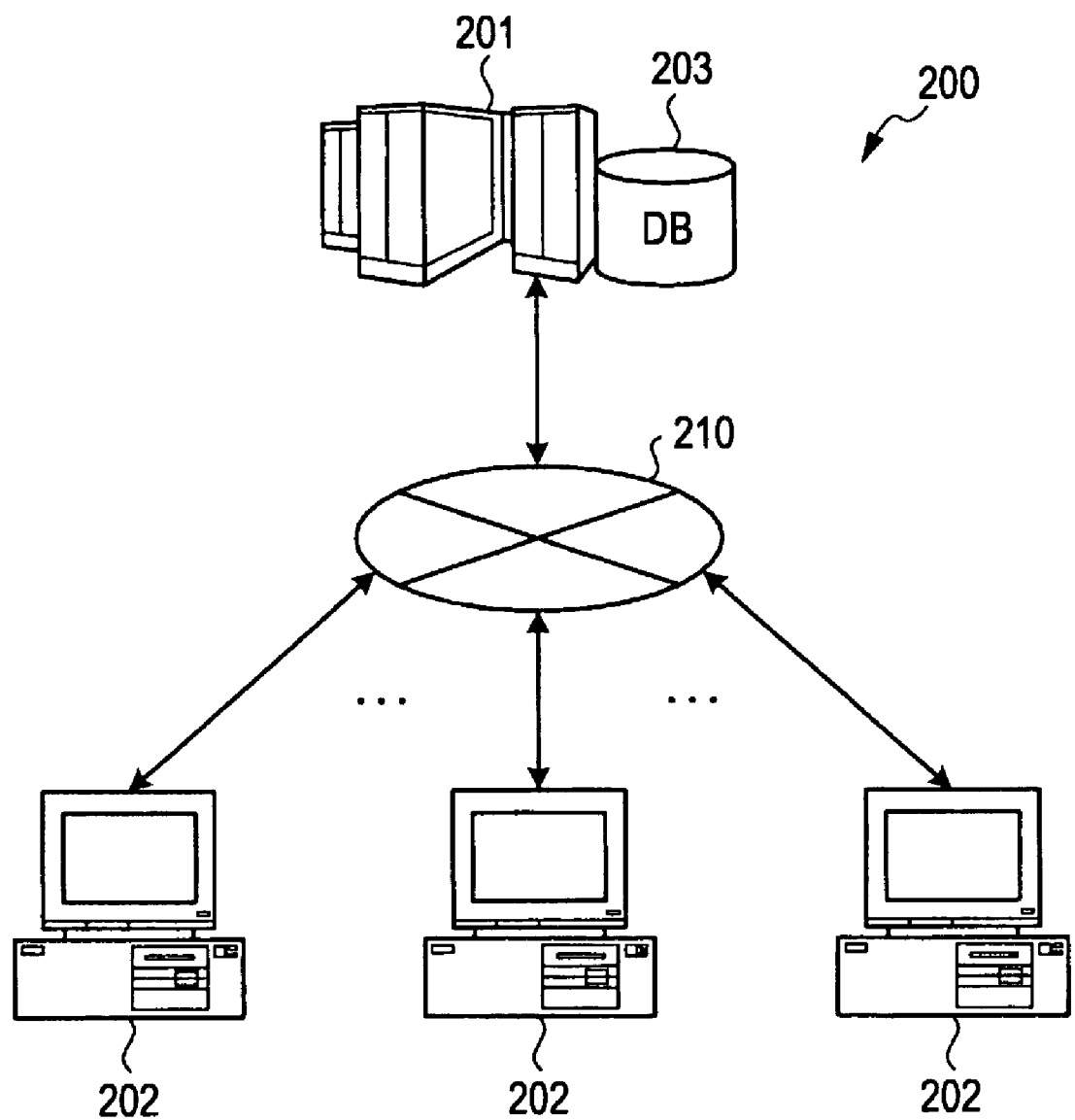
FIG. 2 is a diagram showing system configuration of an assembly information management system according to an embodiment.

FIG. 2 is a diagram showing system configuration of an assembly information management system according to an embodiment. An assembly information management system 200 is a system to manage a set of assembly information (new registration and geometric model updates) and corresponds, for example, to a three-dimensional CAD system. In the assembly information management system 200, an assembly information management apparatus 201, serving as a server, and clients 202 are mutually communicably connected via a network 210 such as the Internet, LAN, or WAN. The assembly information management apparatus 201 is provided with a database (hereinafter, referred to as "DB") 203 to store assembly information and three-dimensional geometric models of parts constituting the assembly information.

The assembly information management apparatus 201 newly registers or updates assembly information and parts and stores assembly information and parts in the DB 203. The assembly information management apparatus 201 is provided with a search function of assembly information and parts and searches for assembly information or parts that match or are related to search conditions transmitted from the client 202 to return search results to the requesting client 202.

The client 202 extracts a geometric model from a directory of the assembly information management apparatus 201 where geometric models are stored and then the geometric model can be edited on the client 202. The client 202 may have, for example, CAD software installed thereon and thus, modifications and design changes of a geometric model may be made using the CAD software. Also, a browser is installed on the client 202, which can display search results transmitted from the assembly information management apparatus 201 after search conditions such as a model name and box information are provided.

(Hardware Configuration of a Computer)

Figure 3:
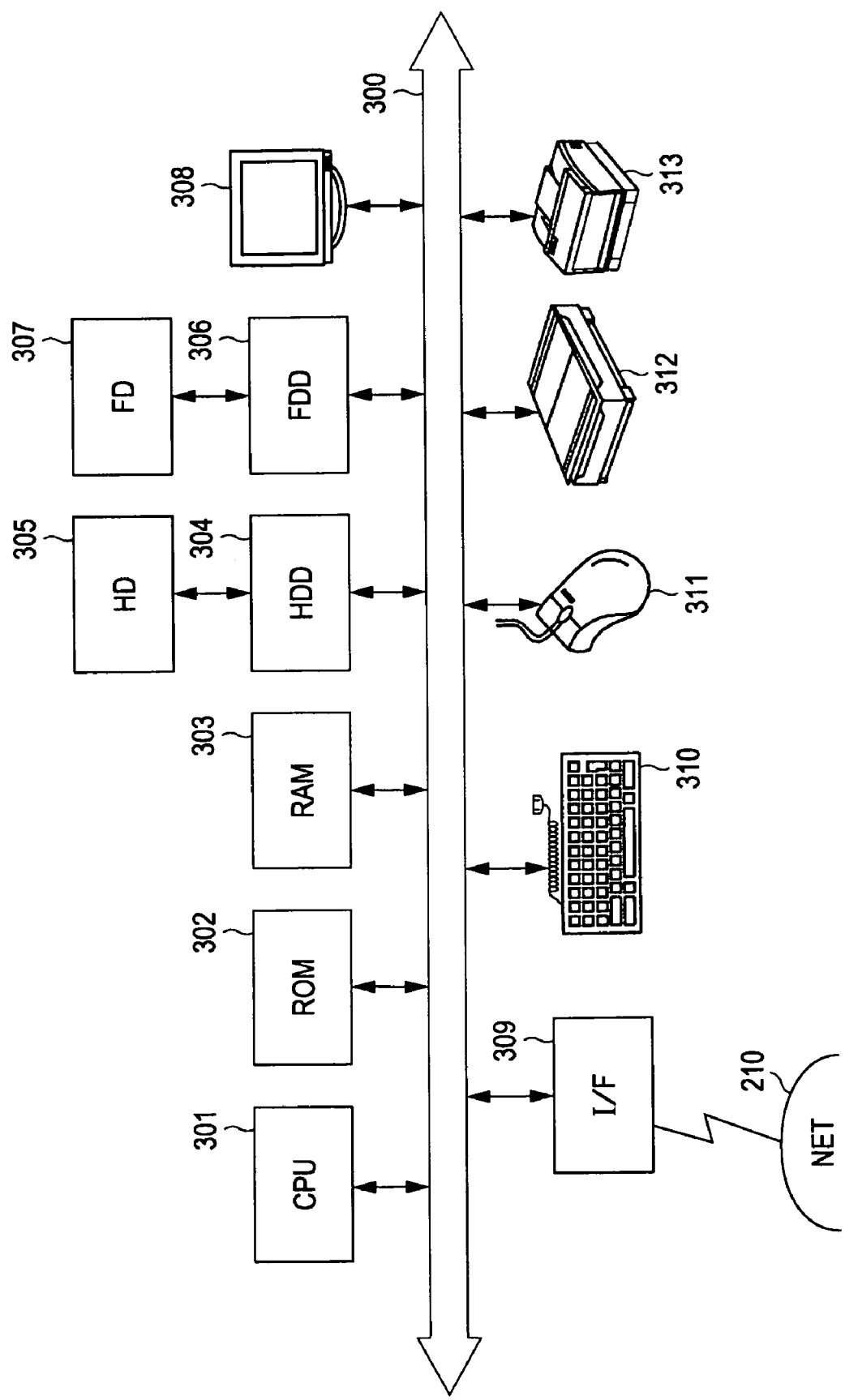
FIG. 3 is a block diagram showing the hardware configuration of computers according to an embodiment.

FIG. 3 is a block diagram showing the hardware configuration of computers (the assembly information management apparatus 201 and the client 202) according to an embodiment. In FIG. 3, each computer may include a CPU 301, a ROM 302, a RAM 303, an HDD (hard disk drive) 304, a HD (hard disk) 305, an FDD (flexible disk drive) 306, an FD (flexible disk) 307 as an example of detachable recording medium, a display 308, an I/F (interface) 309, a keyboard 310, a mouse 311, a scanner 312, and a printer 313. Each constitution part is mutually connected by a bus 300.

Here, the CPU 301 controls the whole computer. The ROM 302 stores programs such as a boot program. The RAM 303 is used as a work area of the CPU 301. The HDD 304 controls reading/writing of data from/in the HD 305 under control of the CPU 301. The HD 305 stores data written under control of the HDD 304.

The FDD 306 controls reading/writing of data from/in the FD 307 under control of the CPU 301. The FD 307 stores data written under control of the FDD 306 and causes the computer to read data stored in the FD 307.

In addition to the FD 307, a CD-ROM (CD-R, CD-RW), MO, DVD (Digital Versatile Disk), and memory card may be used as detachable recording media. The display 308 displays a cursor, icons, toolboxes and also data such as documents, images, and functional information. As the display 308, for example, a CRT, a TFT liquid crystal display, or a plasma display may be adopted.

The I/F 309 is connected to the network 210 such as the Internet via a communication line to be connected to other devices via the network 210. Then, the I/F 309 serves as the interface between the network 210 and the inner parts and controls input/output of data from/to external devices. A modem or a LAN adapter, for example, may be adopted as the I/F 309.

The keyboard 310 is provided with keys for input of characters, numerical characters, and various instructions to input data. The keyboard 310 may be a touch-panel input pad or a numerical keypad. The mouse 311 may be used for moving the cursor, selecting a range, and also moving and changing the size of a window. A track ball or joystick provided with similar functions as a pointing device may also be used.

The scanner 312 optically reads images to capture image data into a computer. The scanner 312 may also have an OCR function. The printer 313 prints image data and document data. A laser printer or an inkjet printer may be adopted as the printer 313.

(Example of the Three-Dimensional Geometric Model)

Figure 4:
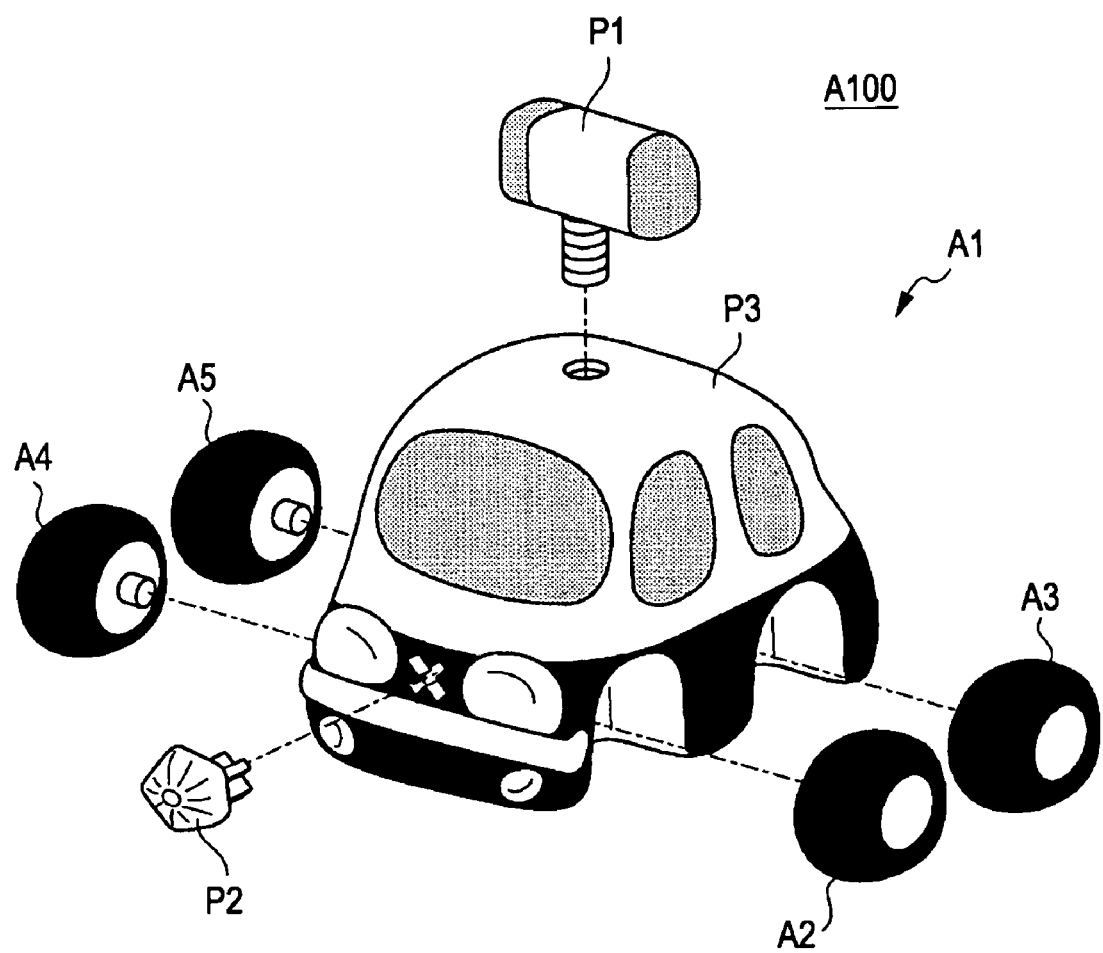
FIG. 4 is an exploded perspective view exemplifying a three-dimensional geometric model of the assembly information A1.
Figure 5:
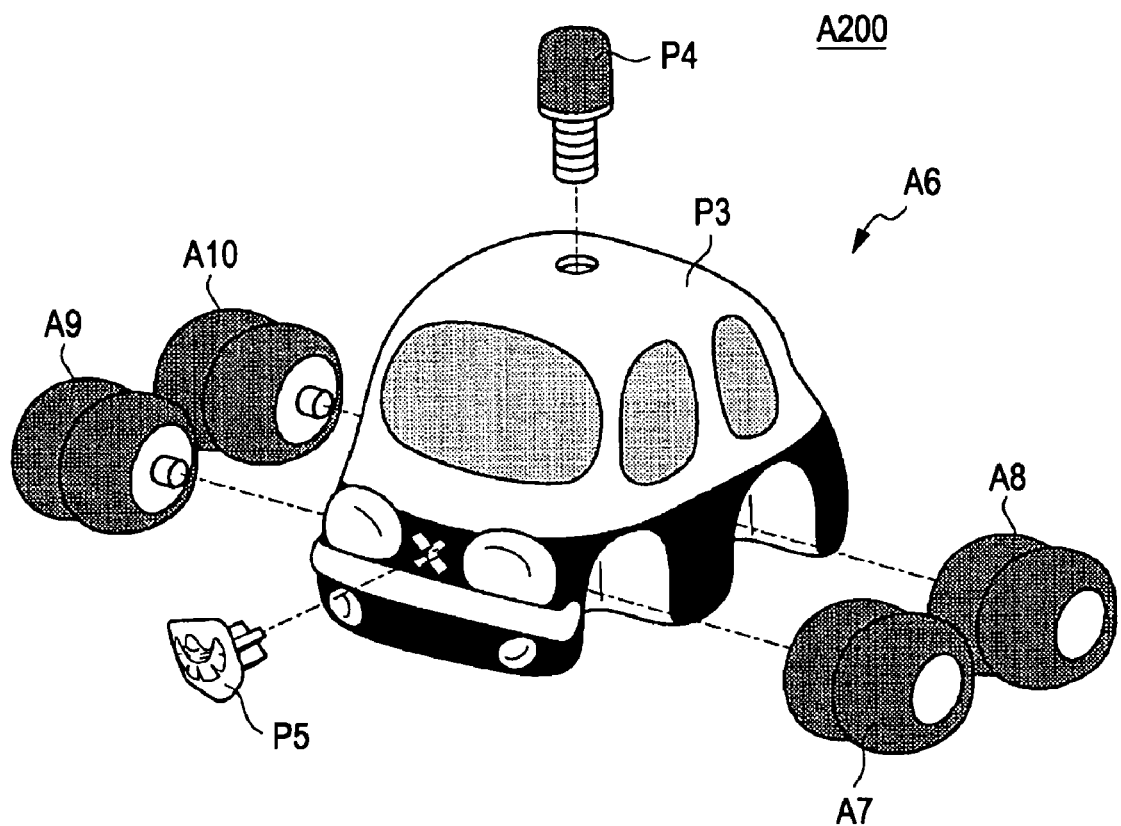
FIG. 5 is an exploded perspective view exemplifying a three-dimensional geometric model of assembly information A6.

Next, the three-dimensional geometric model will be described by showing an example thereof. FIG. 4 and FIG. 5 are exploded perspective views exemplifying the three-dimensional geometric model.

In FIG. 4, the part P1 is a warning light, the part P2 is an emblem, and the part P3 is a main body. The assembly information A1 is a three-dimensional geometric model of a body having these parts P1 to P3 as components. Assembly information A2 to A5 is assembly information to be three-dimensional geometric models of tires. Each piece of the assembly information for the tires is also constituted by a combination of various parts, but details thereof are omitted here. Assembly information A100 is a three-dimensional geometric model of an automobile having the assembly information A1 to A5 as components.

In FIG. 5, a part P4 is a warning light and a part P5 is an emblem. The main body uses the part P3. The assembly information A6 is a three-dimensional geometric model of a body having these parts P3 to P5 as components. The part P3 is a common part shared by the assembly information A1 and the assembly information A6. Assembly information A7 to A10 is assembly information of three-dimensional geometric models of tires. Each piece of the assembly information for the tires is also constituted by a combination of various parts, but details thereof are omitted here. Assembly information A200 is a three-dimensional geometric model of an automobile having the assembly information A6 to A10 as components.

Figure 6:
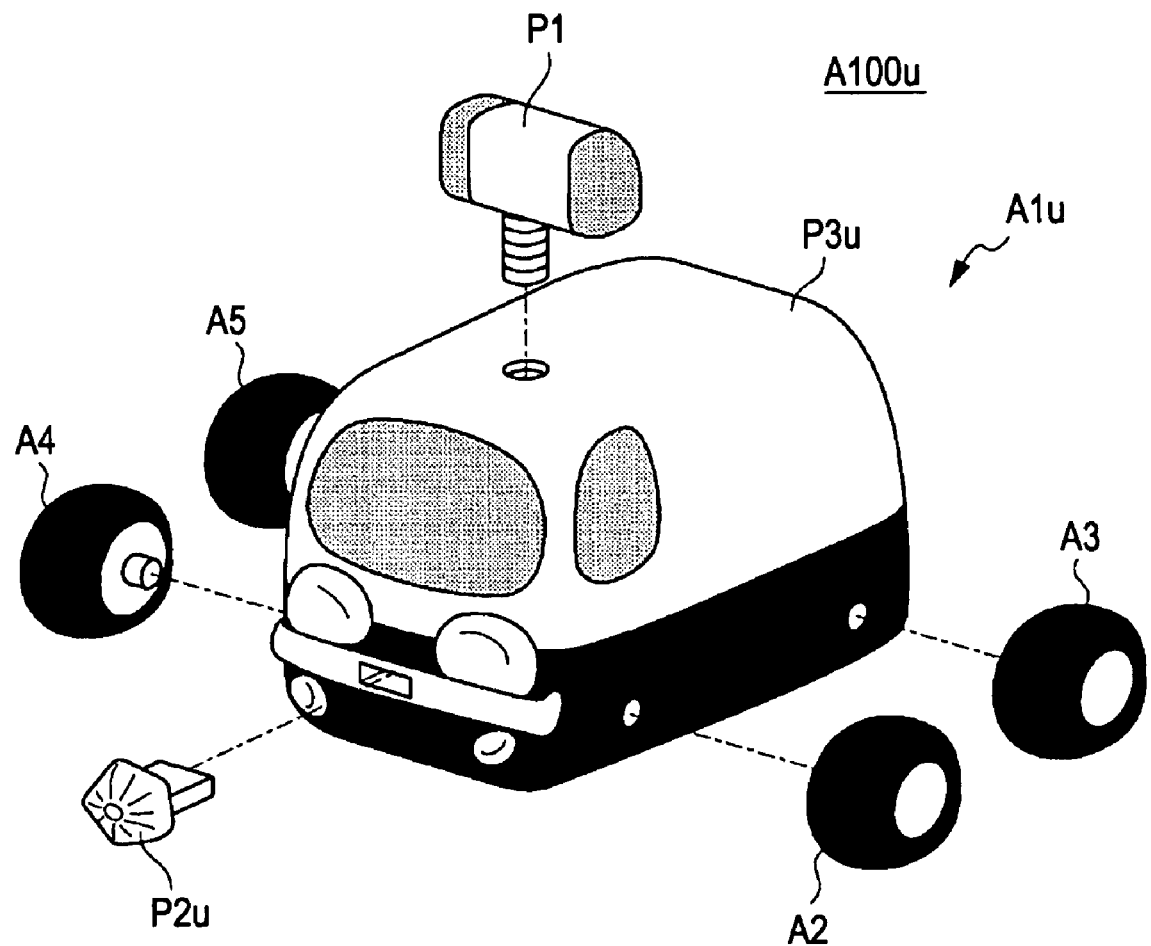
FIG. 6 is an exploded perspective view showing a three-dimensional geometric model of assembly information A100u after a common part is updated.

FIG. 6 is an exploded perspective view showing a three-dimensional geometric model of assembly information A100u after the common part P3 being updated. In FIG. 6, the part P3, which is a main body, is updated to a part P3u and the part P2, which is an emblem, to a part P2u.

Figure 7:
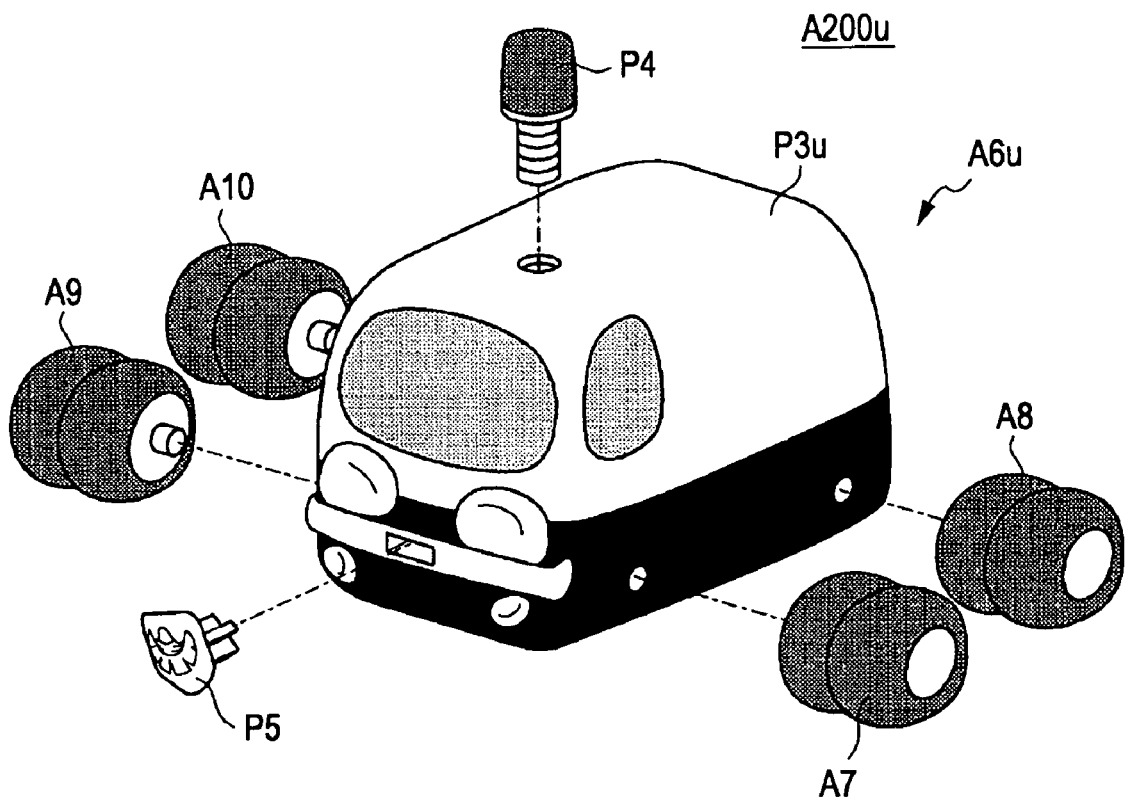
FIG. 7 is an exploded perspective view showing a three-dimensional geometric model of assembly information A200u after the common part is updated.

FIG. 7 is an exploded perspective view showing a three-dimensional geometric model of assembly information A200u after the common part P3 being updated. In FIG. 7, since the part P3, which is a main body, is updated to the part P3u in the assembly information A1, as shown in FIG. 6, the body is also updated from the part P3 to the part P3u in the assembly information A6, which is updated to assembly information A6u.

(Storage Content of the DB 203)

Next, storage content of the DB 203 shown in FIG. 2 will be described. In the DB 203, hierarchical structure information of assembly information, a geometric model DB, an assembly information table, and a part information table are stored.

Figure 8A:
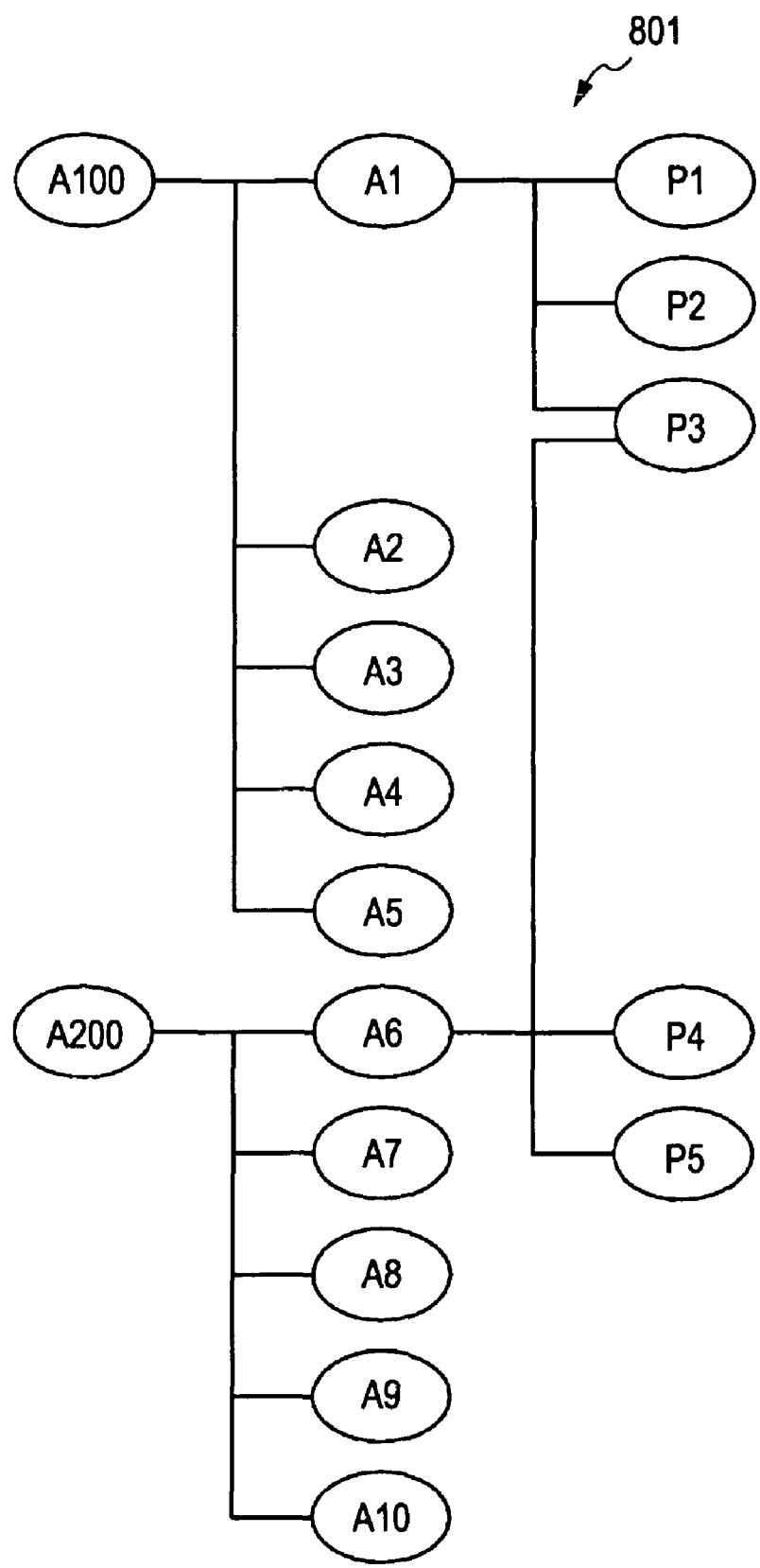
FIG. 8A is an explanatory diagram showing hierarchical structure information of assembly information.

FIG. 8A is an explanatory diagram showing hierarchical structure information of assembly information. In FIG. 8A, hierarchical structure information 801 shows a hierarchical relationship between the assembly information A100 shown in FIG. 4 and the assembly information A200 shown in FIG. 5. FIG. 8A shows that the part P3 is a common part of the assembly information A1 and the assembly information A6.

Figure 8B:
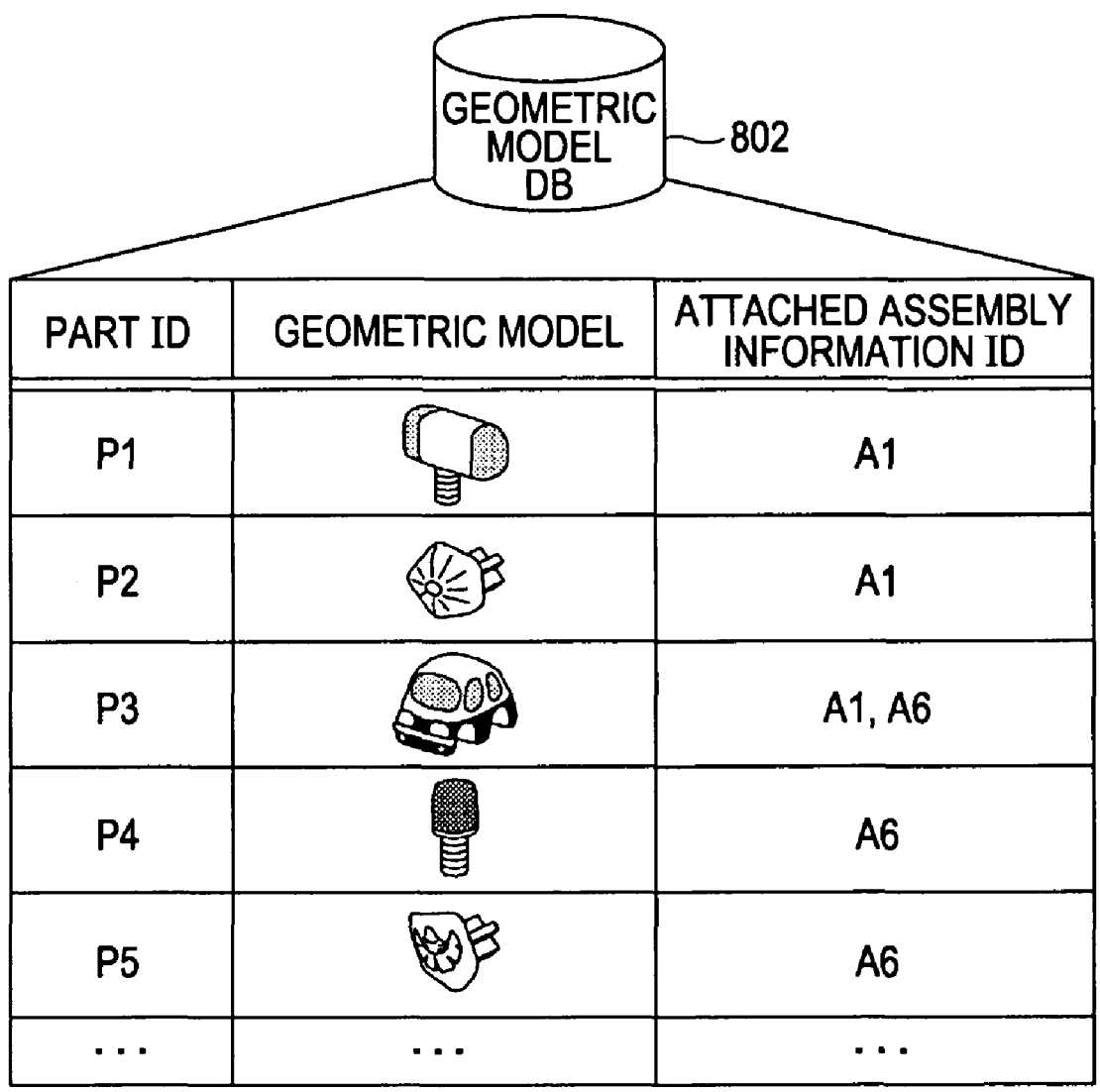
FIG. 8B is an explanatory diagram showing storage content of a geometric model DB.

FIG. 8B is an explanatory diagram showing storage content of a geometric model DB 802. In FIG. 8B, a part ID, geometric model, and attached assembly information ID are stored for each part in the geometric model DB 802. The part ID is identification information of each part. The geometric model is three-dimensional data showing the shape of a part and can be edited by design software such as CAD. The attached assembly information ID is identification information of assembly information of which a geometric model is a component. If there are two or more attached assembly information Ids for one part, the part is a common part. The geometric model DB 802 is arranged as the DB 203 shown in FIG. 2 and realizes the function thereof by a storage area such as the ROM 302, the RAM 303, or the HD 305 shown in FIG. 3.

(Storage Content of the Assembly Information Table)

FIG. 9 is an explanatory diagram showing storage content of an assembly information table. In FIG. 9, an assembly information ID, a part ID, box information, and an update flag are stored for each piece of assembly information in an assembly information table 900. The assembly information ID is identification information of assembly information. The part ID is, as shown in FIG. 8, identification information of each part. The box information is box information of a three-dimensional geometric model identified by assembly information.

In the box information, the first alphabet in parentheses denotes the coordinate axis, two intermediate characters denote the assembly information ID, and the end alphabet "a" denotes a maximum value and the end alphabet "b" a minimum value. "xA1a", for example, denotes the maximum value of the coordinate value of the X coordinate in the assembly information A1, and "xA1b" denotes the minimum value of the coordinate value of the X coordinate in the assembly information A1.

The update flag f is a flag showing whether or not recalculation of box information of assembly information is needed and, if f=1, recalculation is needed. If f=0, recalculation is not needed. The assembly information table 900 is arranged in the DB 203 shown in FIG. 2. Specifically, the assembly information table 900 realizes the function thereof by a storage area such as the ROM 302, the RAM 303, or the HD 305 shown in FIG. 3.

(Storage Content of a Part Information Table 1000)

FIG. 10 is an explanatory diagram showing storage content of a part information table. In FIG. 10, a part ID, box information of the part, and an update flag F are stored for each part in the part information table 1000.

In the box information, the first alphabet in parentheses denotes the coordinate axis, two intermediate characters denote the part ID, and the end alphabet "a" denotes a maximum value and the end alphabet "b" a minimum value. "xP1a", for example, denotes the maximum value of the coordinate value of the X coordinate in the part P1 and "xP1b" denotes the minimum value of the coordinate value of the X coordinate in the part P1.

The update flag f is a flag showing whether or not recalculation of box information of a part is needed and if f=1, recalculation is needed. If f=0, recalculation is not needed. The part information table 1000 is arranged in the DB 203 shown in FIG. 2. Specifically, the part information table 1000 realizes the function thereof by a storage area such as the ROM 302, the RAM 303, or the HD 305 shown in FIG. 3.

(Functional Configuration of the Assembly Information Management Apparatus 201)

Figure 11:
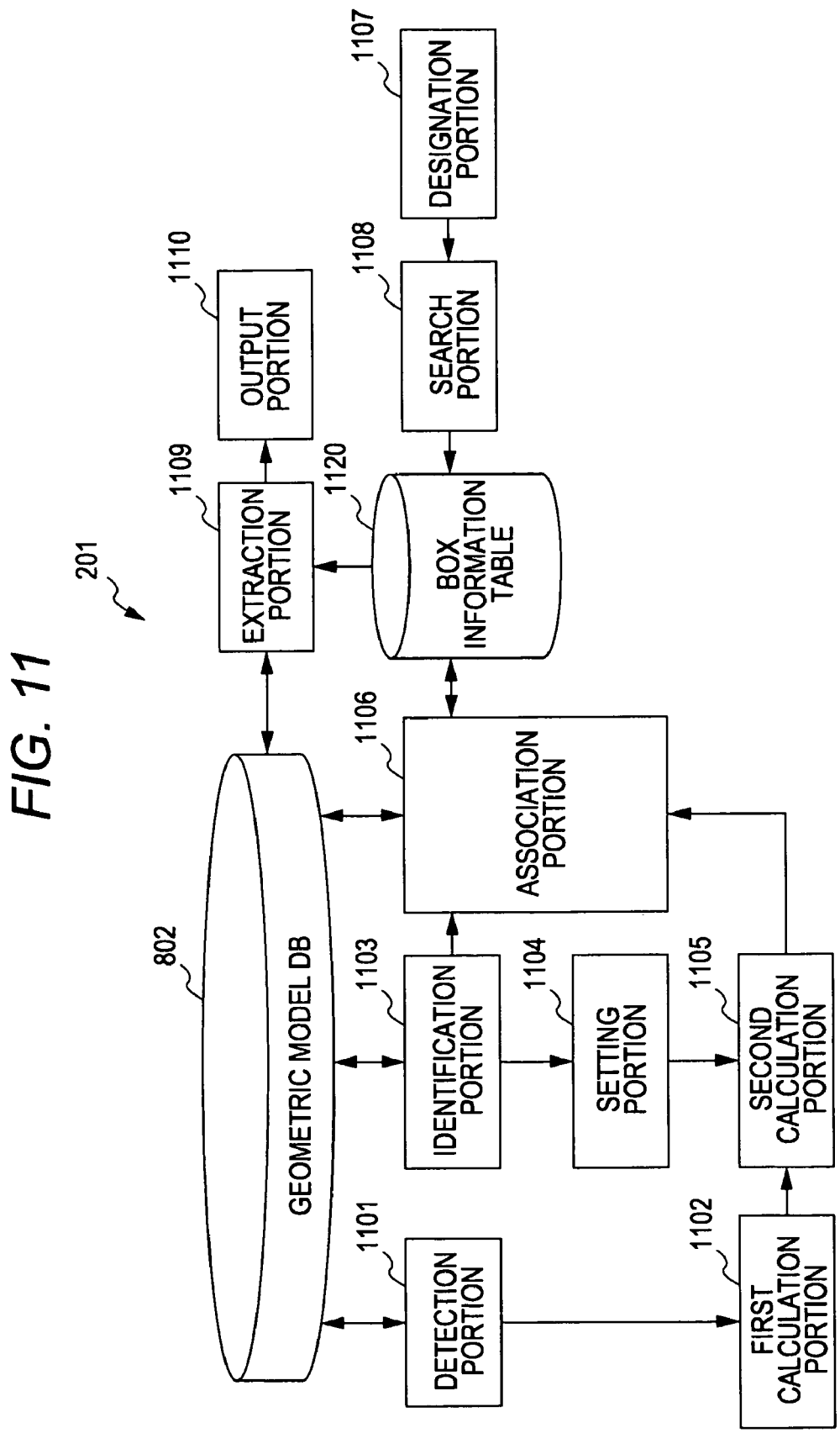
FIG. 11 is a block diagram showing the functional configuration of an assembly information management apparatus.

FIG. 11 is a block diagram showing the functional configuration of the assembly information management apparatus 201. In FIG. 11, the assembly information management apparatus 201 includes a geometric model DB 802, a box information table 1120, a detection portion 1101, a first calculation portion 1102, an identification portion 1103, a setting portion 1104, a second calculation portion 1105, an association portion 1106, a designation portion 1107, a search portion 1108, an extraction portion 1109, and an output portion 1110.

Specifically, each of these functions is realized by causing the CPU 301 to execute a program stored in a computer readable recording medium such as the ROM 302, the RAM 303, the HD 305, and the like, or by the I/F 309. The box information DB stores the assembly information table 900 shown in FIG. 9 and the part information table 1000 shown in FIG. 10. Specifically, the box information DB realizes the function thereof by a storage area such as the ROM 302, the RAM 303, or the HD 305 shown in FIG. 3.

The detection portion 1101 detects an update of a part (hereinafter, referred to as a selected part) selected from a group of parts constituting any assembly information among a set of assembly information. More specifically, for example, the assembly information management apparatus 201 checks out a part requested from the client 202 and copies the part to the client 202, and checks in the part edited by the client 202 to overwrite the part. The detection portion 1101 detects execution of the overwrite processing.

The first calculation portion 1102 calculates outline shape data of an updated selected part from the selected part detected by the detection portion 1101. More specifically, if, for example, the part P2 and the part P3 are selected in FIG. 4, the box information B2$u$ of the updated part P2$u$ and the box information B3$u$ of the updated part P3$u$ are calculated as shown in FIG. 6. The part information table 1000 is overwritten with the calculated box information B2$u$ and box information B3$u$.

The identification portion 1103 identifies a common assembly information group sharing a selected part from a set. Here, the common assembly information group is a set of assembly information sharing a selected part. This identification is implemented by referencing the attached assembly information ID of the geometric model DB 802 shown in FIG. 8B. In the examples shown in FIG. 4 to FIG. 7, the common assembly information group is a set of the assembly information A1 (A1$u$) and the assembly information A2 (A2$u$) having the part P3 as a common part.

The setting portion 1104 sets a common assembly information group as an assembly information group to be calculated each time a common assembly information group is identified by the identification portion 1103. More specifically, the update flag f of common assembly information is changed from f=0 to f=1. Assembly information whose update flag f is set to f=1 is assembly information to be calculated.

In the examples shown in FIG. 4 and FIG. 5, for example, the part 3 is a common part of the assembly information A1 and the assembly information A6. Thus, when the part P3 is updated in the assembly information A1, the update flag f is changed from f=0 to f=1 not only in the assembly information A1, but also in the assembly information A6. Accordingly, the assembly information A1 and the assembly information A6 become assembly information to be calculated.

The second calculation portion 1105 calculates outline shape data of common assembly information for each piece of common assembly information identified by the identification portion 1103 based on outline shape data of remaining parts after excluding a selected part constituting the common assembly information and outline shape data of the updated selected part calculated by the first calculation portion 1102. More specifically, the second calculation portion 1105 recalculates box information for assembly information to be calculated set by the setting portion 1104.

If, for example, the assembly information A1 (A1$u$) and the assembly information A6 (A6$u$) are set as assembly information to be calculated after the common part P3 is edited, box information of the updated assembly information A1$u$ is calculated by accumulating the box information b1 and b2 of the remaining parts P1 and P2 of the assembly information A1 and box information b3$u$ of the part P3$u$ (See FIG. 6) which is an updated version of the part P3.

Similarly, since the update flag f is also set in the assembly information A6, box information B6$u$ of the updated assembly information A6$u$ is calculated by accumulating and calculating the box information b4 and b5 of the remaining parts P4 and P5 of the assembly information A6 and the box information b3$u$ of the part P3$u$ which is an updated version of the part P3.

The timing of calculation by the second calculation portion 1105 may be a given timing, for example, once a day at a given time. Accordingly, wasteful calculation processing may be reduced because even if the same assembly information is edited more than once, box information is calculated in a final edited state.

The timing of calculation by the second calculation portion 1105 may be each time when the update flag f changes to f=1. Accordingly, box information of common assembly information may be changed in real time and thus, correct box information can typically be obtained, improving search precision.

The association portion 1106 associates each piece of common assembly information with outline shape data calculated by the second calculation portion 1105. More specifically, new box information and assembly information thereof are associated after, for example, the assembly information table 900 is overwritten with box information of assembly information recalculated by the second calculation portion 1105. The update flag f is thereby reset.

The designation portion 1107 has a function to receive designation of optional assembly information. More specifically, assembly information is designated by the assembly information ID. The designated assembly information becomes a search condition for searching surrounding assembly information. This designation may be performed by the client 202.

The search portion 1108 searches for surrounding assembly information of assembly information designated by the designation portion 1107 based on outline shape data of the designated assembly information. The surrounding assembly information is assembly information on joining, binding, or adjoining relationships with the designated assembly information.

Then, whether box information of the designated assembly information and that of surrounding assembly information overlaps or not is determined. If such information overlaps, the designated assembly information and surrounding assembly information thereof may interfere and thus, assembly information IDs of the surrounding assembly information are output as a search result. If such information does not overlap, on the other hand, the designated assembly information and surrounding assembly information thereof do not interfere and thus, assembly information IDs of the surrounding assembly information are not output as a search result.

In the assembly information A6u shown in FIG. 7, for example, the assembly information A7 to A10 of tires are not contained in the part P3u of the main body due to an update of the part P3 and thus, the box information B6u of the assembly information A6u and box information B7 to B10 of the assembly information A7 to A10 overlap each other. Therefore, assembly information IDs: A7 to A10 are output as assembly information IDs of surrounding assembly information.

The extraction portion 1109 extracts assembly information associated by the association portion 1106 with a search result searched by the search portion 1108 from the geometric model DB 802. More specifically, for example, the hierarchical structure information 801 shown in FIG. 8A is referenced to extract a geometric model of assembly information identified based on a search result.

The output portion 1110 outputs an extraction result extracted by the extraction portion 1109. More specifically, after a geometric model of the extracted assembly information is transmitted to the client 202 that requested a search, the geometric model is checked out on CAD of the client 202. Thus, the file checkout of the geometric model without interference is not conducted since only the geometric models with overlapping box information are checked out by the CAD, and so search efficiency may be improved. Therefore, interference checks by a designer using the client 202 can be performed smoothly.

(Assembly Information Management Sequence)

Figure 12:
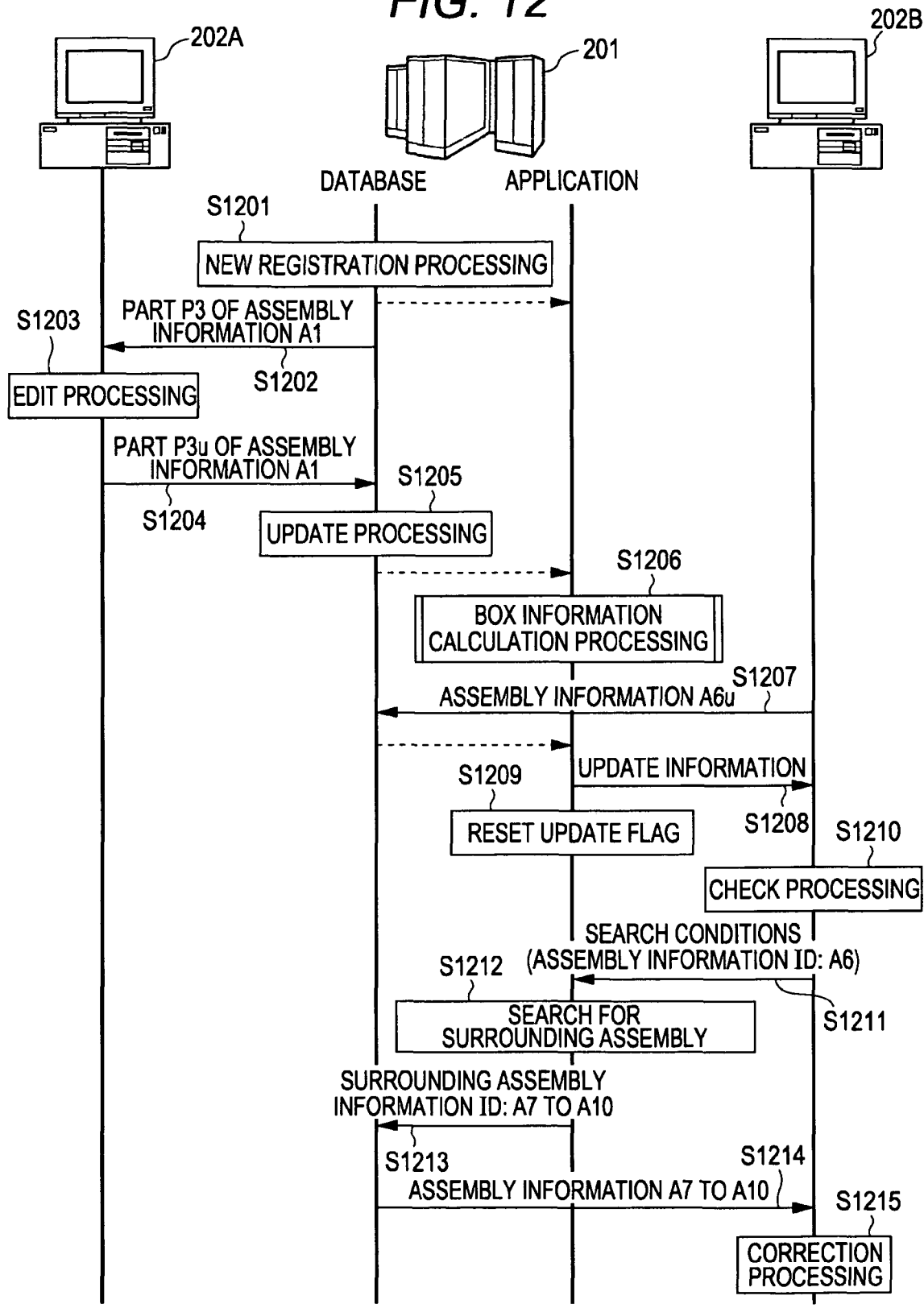
FIG. 12 is an explanatory diagram showing an assembly information management sequence.

FIG. 12 is an explanatory diagram showing an assembly information management sequence. In FIG. 12, a client 202A is a computer designing the assembly information A1 and a client 202B is a computer designing the assembly information A6. The assembly information management apparatus 201 will be described regarding database processing and application processing (corresponding to functions in FIG. 11) separately. A dotted line arrow in FIG. 12 indicates a processing request.

First, when assembly information or parts are newly provided, the assembly information management apparatus 201 performs new registration processing (step S1201). In the new registration processing, geometric models of new parts are registered in the geometric model DB 802. Assembly information IDs to which newly registered parts belong are also registered in the geometric model DB 802.

When a request of a part is made by the client 202A, the assembly information management apparatus 201 checks out the part (step S1202). In this example, the part P3 of the assembly information A1 shown in FIG. 4 is checked out. The client 202A performs edit processing on the checked-out part P3 (step S1203). More specifically, for example, the part P3 is expanded on CAD and a designer makes modifications.

Then, the edited part P3u is transmitted to the assembly information management apparatus 201 which checks in the part P3u (step S1204). Then, the assembly information management apparatus 201 performs update processing of the checked-in part P3u, that is, overwrites the geometric model DB 802 with the part P3u (step S1205).

If new registration processing (step S1201) or update processing (step S1205) is performed, the assembly information management apparatus 201 performs box information calculation processing (step S1206). The box information calculation processing will be described later.

Subsequently, when the assembly information A6u is checked out to the client 202B (step S1207), the assembly information management apparatus 201 transmits update information to the client 202B together with the checked-out assembly information A6u (step S1208). The update information is information indicating that the box information B6u recalculated after the assembly information A6 is updated has a value different from that of the box information B6 before recalculation.

Transmission/non-transmission of the update information is determined by holding the box information B6 and B6u before/after update in the assembly information table 900. If there is any difference between the box information, the update information is transmitted to the client 202B. Alternatively, in a more simplified manner, the update information may be transmitted when the value of the update flag f is f=1.

Subsequently, the assembly information management apparatus 201 resets the value of the update flag f to f=0 and also the update flag f of the part information table 1000 to f=0 (step S1209). Since the assembly information A6u is checked out, the assembly information A6u is displayed on the screen of the client 202B. By receiving update information, a message indicating that the assembly information A6u has been updated from the assembly information A6 may be displayed and the updated part P3u in the assembly information A6u may be highlighted.

Since a designer using the client 202B knows that the box information B6 of the assembly information A6 has been updated in this manner, the designer performs an interference check with surrounding assembly information. More specifically, the designer transmits the assembly information ID of the assembly information A6 designed by the designer to the assembly information management apparatus 201 as a search condition (step S1211). The assembly information management apparatus 201 searches for surrounding assembly information of the assembly information A6 using the search portion 1108 (step S1212).

The surrounding assembly information A7 to A10 is identified, for example, by referencing the hierarchical structure information 801 shown in FIG. 8A. Then, the box information B7 to B10 of the surrounding assembly information A7 to A10 and the box information B6u of the designated assembly information A6 (A6u) are read to identify box information overlapping with the box information B6u.

In this case, all box information B7 to B10 overlaps with the box information B6u and thus, the application provides surrounding assembly information IDs: A7 to A10 thereof to the database (step S1213). The database invokes geometric models of the assembly information A7 to A10 identified by the surrounding assembly information IDs A7 to A10 by referencing the hierarchical structure information 801 shown in FIG. 8A to file check out the assembly information A7 to A10 to the client 202B (step S1214).

The assembly information A6u and the assembly information A7 to A10 are displayed on CAD of the client 202B in an overlapping state so that interference checks between assembly information can be performed. The designer using the client 202B performs modification processing so that assembly information does not overlap (step S1215). Interference between assembly information can thereby be avoided. The modification processing may be performed by a mouse operation or the like or existing interference checks.

Figure 13:
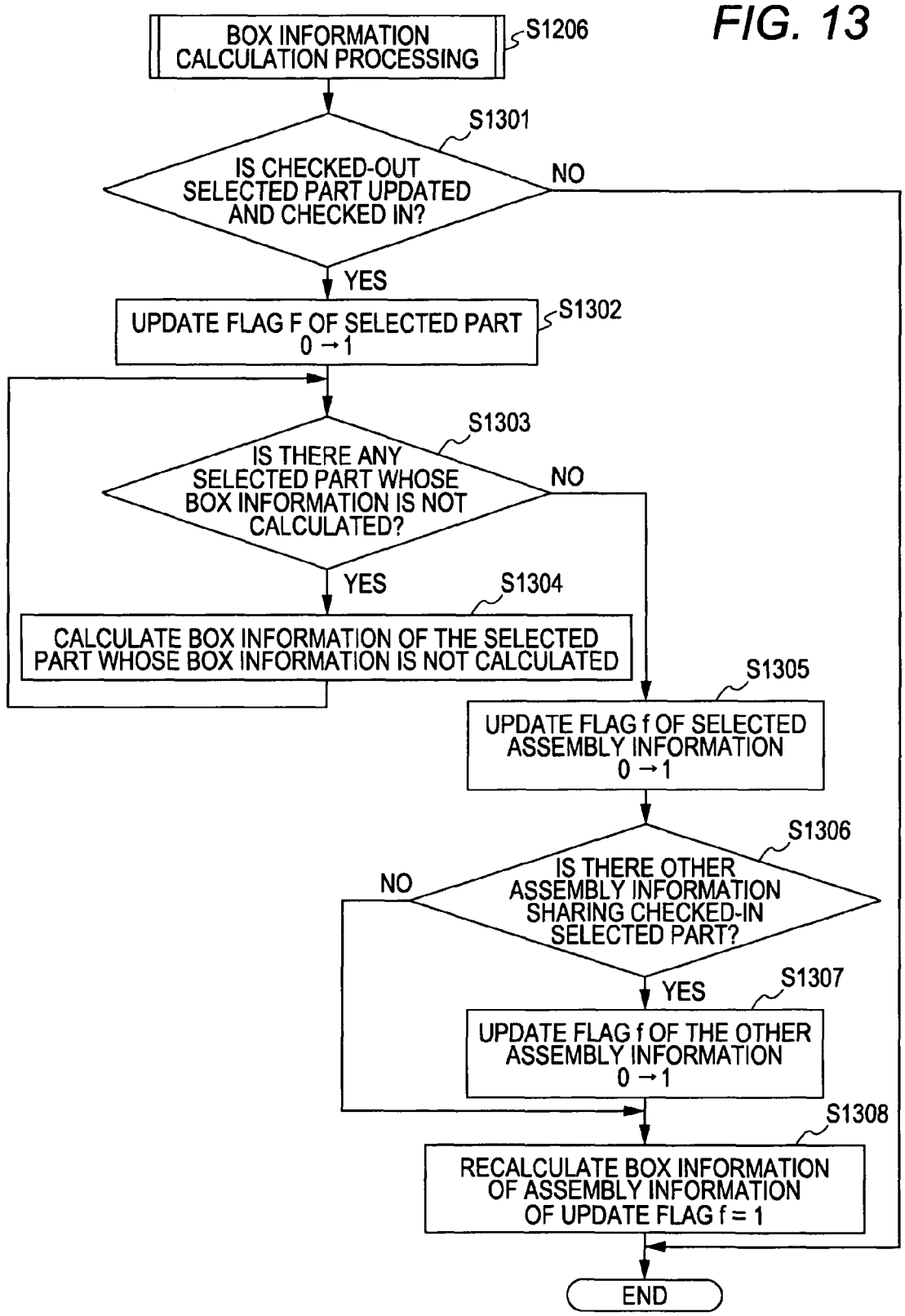
FIG. 13 is a flow chart showing a processing procedure for box information calculation processing.

FIG. 13 is a flow chart showing a specific processing procedure for box information calculation processing (step S1206). In FIG. 13, whether a checked-out selected part (here, the part P3 as an example) is checked in or not after being updated is determined (step S1301). Whether or not the selected part has been updated can be determined, for example, by a change in data size of the selected part. If not checked in after being updated (step S1301: No), there is no need to calculate box information and thus, processing terminates.

If checked in after being updated (step S1301: Yes), on the other hand, the update flag f of the selected part in the part information table 1000 is set to f=1 (step S1302). Then, whether or not there is any selected part whose box information is not calculated among a group of selected parts of the update flag f (f=1) is determined (step S1303).

If there is any selected part whose box information is not calculated (step S1303: Yes), one selected part whose box information is not calculated is selected to calculate box information (step S1304) and processing returns to step S1302. If, on the other hand, there is no selected part whose box information is not calculated (step S1303: No), the update flag f of the selected assembly information (here, the assembly information A1 as an example) of the selected part is set to f=1 (step S1305).

FIG. 14 is an explanatory diagram showing storage content of the part information table 1000 in a state at step S1304. In FIG. 14, box information of the part P3, which is the selected part, is updated by recalculation. Updated box information is shown with hatching.

In FIG. 13, whether or not there is other assembly information sharing the checked-in selected part is determined from the attached assembly information ID of the geometric model DB 802 (step S1306). If there is no other assembly information to be common assembly information (step S1306: No), processing moves to step S1308. If, on the other hand, there is other assembly information to be common assembly information (step S1306: Yes), the update flag f of the other assembly information is set to f=1 (step S1307).

FIG. 15 is an explanatory diagram showing storage content of the assembly information table 900 in a state at step S1307. In FIG. 15, the update flags f of the assembly information A1 and the assembly information A6, which form a common assembly information group, are set to f=1. In FIG. 13, box information of the assembly information A1 and the assembly information A6 with the update flag f set to f=1 is recalculated (step S1308). Since it is unknown in the other sharing assembly information whether or not the value of box information has been changed, the color of the name of the assembly information is changed on a structure tree of the system if there is any part under the assembly information whose update date is more recent than the update date of the assembly information. Because of this color change, a designer who accesses the system can visually recognize that box information has been updated.

FIG. 16 is an explanatory diagram showing storage content of the assembly information table 900 in a state at step S1308. In FIG. 16, box information of the assembly information A1 and the assembly information A6 with the update flag f set to f=1 is updated by recalculation. Updated box information is shown with hatching. This completes a sequence of box information calculation processing.

FIG. 17 is an explanatory diagram showing storage content of the assembly information table 900 when the update flag is reset (step S1209) after the box information calculation processing (step S1206). FIG. 18 is an explanatory diagram showing storage content of the part information table 1000 when the update flag is reset (step S1209) after the box information calculation processing (step S1206). By resetting the update flag f to 0, as shown above, unnecessary recalculation can be prevented.

According to the present embodiment, as described above, if a common part in one piece of assembly information of common assembly information sharing the common part is updated, box information of a common assembly information group is recalculated using box information of the common part after being updated. Therefore, since box information used for interference checks always corresponds to the latest geometric model, interference checks with surrounding assembly information may be made more precise. Consequently, erroneous interference checks may be prevented so that an efficient and highly precise three-dimensional model can be designed.

The assembly information management method described in the present embodiment can be realized by executing a prepared program on a computer such as a personal computer or a workstation. The program is recorded in a computer readable recording medium, such as a hard disk, flexible disk, CD-ROM, MO, and DVD, and executed by being read by the computer from the recording medium. The program may also be a medium that can be distributed via the network 210 such as the Internet.

The assembly information management apparatus 201 described in the present embodiment can also be realized by application specific integrated circuit (hereinafter, simply referred to as "ASIC") such as standard cells and structured ASIC and PLD (Programmable Logic Device) such as FPGA. More specifically, the assembly information management apparatus 201 can be manufactured, for example, by defining the above functions 1101 to 1110 of the assembly information management apparatus 201 by an HDL description and logically synthesizing the HDL description to provide the ASIC or PLD.

The invention claimed is:

1. A non-transitory computer readable recording medium having recorded therein an assembly information management program causing a computer managing a set of assembly information, which is a unit in which a plurality of parts is assembled, to function as:
    a detection portion to detect an update of a selected part selected from a group of parts constituting any assembly information in the set;
    a first calculation portion to calculate outline shape data of the selected part after being updated from the selected part detected by the detection portion;
    an identification portion to identify, from the set, a common assembly information group sharing the selected part, each of the common assembly information including information of part and assembly information including the information of part;
    a second calculation portion to calculate outline shape data of common assembly information for each piece of common assembly information identified by the identification portion based on outline shape data of remaining parts after excluding the selected part constituting the common assembly information and outline shape data of the selected part after being updated calculated by the first calculation portion; and
    an association portion to associate each piece of the common assembly information with outline shape data calculated by the second calculation portion.

2. The non-transitory computer readable recording medium having recorded therein an assembly information management program according to claim 1, wherein the outline shape data of the selected part is data whose data size is smaller than that of the selected part, and
    the outline shape data of the common assembly information is data whose data size is smaller than that of a group of parts constituting the common assembly information.

3. The non-transitory computer readable recording medium having recorded therein an assembly information management program according to claim 2, wherein the outline shape data is box information.

4. The non-transitory computer readable recording medium having recorded therein an assembly information management program according to any of claims 1 to 3, wherein the computer is caused to function as a setting portion to set the common assembly information group as an assembly information group to be calculated each time the common assembly information group is identified by the identification portion, the second calculation portion calculates outline shape data of each of the assembly information to be calculated based on outline shape data of the selected part after being updated and outline shape data of remaining parts after excluding the selected part constituting the common assembly information to be calculated set by the setting portion in a given timing, and the association portion associates each piece of the assembly information to be calculated with the outline shape data calculated by the second calculation portion.

5. The non-transitory computer readable recording medium having recorded therein an assembly information management program according to any of claims 1 to 3, wherein the computer is caused to function as a setting portion to set the common assembly information group as an assembly information group to be calculated each time the common assembly information group is identified by the identification portion, the second calculation portion calculates outline shape data of each of the assembly information to be calculated based on outline shape data of the selected part after being updated and outline shape data of remaining parts after excluding the selected part constituting the common assembly information to be calculated each time the assembly information group to be calculated is set by the setting portion, and the association portion associates each piece of the assembly information to be calculated with the outline shape data calculated by the second calculation portion.

6. An assembly information management apparatus for managing a set of assembly information constituted by a plurality of parts, comprising:

a detection portion to detect an update of a selected part selected from a group of parts constituting any assembly information in the set;

a first calculation portion to calculate outline shape data of the selected part after being updated from the selected part detected by the detection portion;

an identification portion to identify a common assembly information group sharing the selected part from the set, each of the common assembly information including information of part and assembly information including the information of part;

a second calculation portion to calculate outline shape data of common assembly information for each piece of common assembly information identified by the identification portion based on outline shape data of remaining parts after excluding the selected part constituting the common assembly information and outline shape data of the selected part after being updated calculated by the first calculation portion; and an association portion to associate each piece of the common assembly information with outline shape data calculated by the second calculation portion.

7. An assembly information management method of managing a set of assembly information constituted by a plurality of parts, comprising:

detecting an update of a selected part selected from a group of parts constituting any assembly information in the set;

first calculating outline shape data of the selected part after being updated from the selected part detected by the detecting;

identifying a common assembly information group sharing the selected part from the set, each of the common assembly information including information of part and assembly information including the information of part;

second calculating outline shape data of common assembly information for each piece of common assembly information identified by the identifying based on outline shape data of remaining parts after excluding the selected part constituting the common assembly information and outline shape data of the selected part after being updated calculated by the first calculating; and associating each piece of the common assembly information with outline shape data calculated by the second calculating.

* * * * *